United States Patent [19]

Toyoda et al.

[11] Patent Number: 4,464,735
[45] Date of Patent: Aug. 7, 1984

[54] SEMICONDUCTOR MEMORY

[75] Inventors: Kazuhiro Toyoda, Yokohama; Yasuhisa Sugo, Tokyo; Katuyuki Yamada, Kawasaki, all of Japan

[73] Assignee: Fujitsu Limited, Kawasaki, Japan

[21] Appl. No.: 329,922

[22] Filed: Dec. 11, 1981

[30] Foreign Application Priority Data

Dec. 25, 1980 [JP] Japan ................................ 55-184564

[51] Int. Cl.³ .......................................... G11C 11/40
[52] U.S. Cl. ..................................... 365/190; 365/155
[58] Field of Search ............... 365/154, 189, 190, 155; 307/355

[56] References Cited

U.S. PATENT DOCUMENTS 3,676,704  7/1972  Donofrio et al. .................... 307/355
3,725,878  4/1973  Berding ............................... 365/190
4,168,539  9/1979  Anderson ............................ 365/190

Primary Examiner—Joseph A. Popek
Attorney, Agent, or Firm—Staas & Halsey

[57] ABSTRACT

A semiconductor memory includes memory cells each respectively provided with a flip-flop circuit in which a pair of transistors is included, the flip-flop circuit being connected to a pair of bit lines and to a pair of word lines. The semiconductor memory further includes a pair of switching transistors connected to the pair of bit lines. One of the pair of switching transistors is turned ON while the other is turned OFF when they receive high and low potentials according to write data at the time of a write operation so as to flow write current from a memory cell to a voltage source via one of the pair of bit lines and one of the pair of switching transistors.

3 Claims, 8 Drawing Figures

PRIOR ART

SEMICONDUCTOR MEMORY

BACKGROUND OF THE INVENTION

1. Field of the Invention

The present invention relates to a semiconductor memory and more particularly to a bipolar memory circuit.

2. Description of the Prior Art

A flip-flop circuit including resistors and diodes was employed in the memory cell of a conventional semiconductor memory. FIG. 1 is a circuit diagram showing a conventional memory cell in which resistors and diodes are employed. Collectors of transistors $Q_3$ and $Q_4$ are connected to a word line $W_i$ through parallel circuits consisting of resistors $R_0$ and diodes $D_0$, and resistor $R_0'$ and diodes $D_0'$, respectively. First emmitters of transistors $Q_3$ and $Q_4$ are connected to bit lines $B_{n0}$ and $B_{n1}$, respectively, while second emitters thereof are connected to a word line $W_{in}$. This is a common arrangement of a flip-flop circuit. When the transistor $Q_3$ is ON, the transistor $Q_4$ is turned OFF, but when the former is OFF, the latter is turned ON. It is necessary that a certain voltage be applied to the resistors to prevent the flip-flop circuit, including the resistors and diodes, from malfunctioning or providing a wrong readout due to noise. It is also necessary in this case that current flowing to the resistors in the cell be made small, or the resistance in the cell be made large so as to reduce the power consumption of the cell, and of the semiconductor memory as a whole. However, it has been difficult to obtain a large resistance value in a highly-integrated memory, or in a small-sized memory cell. Because the resistor must be made structurely long to obtain a large resistance, and thus, such a large-sized resistor could not be provided in a small-sized memory cell.

There are now employed I²L and PNPN memory cells in which PNP transistors, for example, are used as loads instead of resistors. Transistors employed instead of resistors in a memory cell cause current saturation when they are ON, and store charges in the transistors, thereby achieving an anti-noise effect. This memory cell in which transistors were used instead of resistors achieves anti-noise and low power consumption effects, but had a problem in achieving a high speed write operation. The stored charges must be discharged at the time of the write operation and large current must flow, particularly at the time when changeover is made, i.e., from 0 to 1 or from 1 to 0. The speed is therefore made high by setting the write current larger than the readout current. When the write current is set large, however, an extra write time period is needed corresponding to a time perid during which write current is increased. This is because the write operation is performed after the large write current, which is enough to change over the bit lines, i.e., after the write current applied to the bit lines reaches a sufficient level. This time period is influenced by stray capacitance, or the like, in the current switching transistors which serve to increase the current flowing through the bit lines. The capacitance effect of the stray capacitors of the transistors can be reduced by physically making the transistors small-sized, but such small-sized transistors can not serve to increase the current flowing through the transistors, thereby resulting in a low speed operation thereof.

SUMMARY OF THE INVENTION

The object of the present invention is to provide a semiconductor memory capable of achieving a high speed write operation in such a way that the bit lines are driven by a voltage source at the time of the write operation instead of increasing the current value of a current source.

One of the features of the present invention resides in a semiconductor memory including a plurality of memory cells each respectively provided with a flip-flop circuit in which a pair of transistors is included, each flip-flop circuit being connected to a pair of bit lines and a pair of word lines, characterized in that the semiconductor memory comprises a pair of switching transistors, each pair of switching transistors being connected to each pair of bit lines, a pair of bases of the pair of switching transistors receives a pair of complementary signals according to write data so that a write current flows from the memory cell to a voltage source via one of the pair of bit lines and one of the pair of switching transistors.

DETAILED DESCRIPTION OF THE PREFERRED EMBODIMENT OF THE INVENTION

Figure 1:
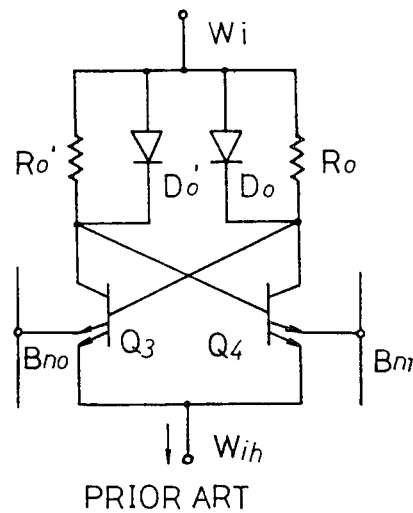
FIG. 1 is a circuit diagram of a conventional prior art memory cell.
Figure 2B:
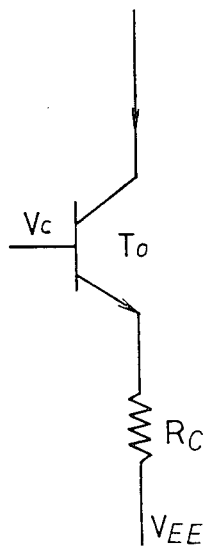
FIG. 2B is a circuit diagram of the prior art constant current source used in the bipolar memory.
Figure 2C:
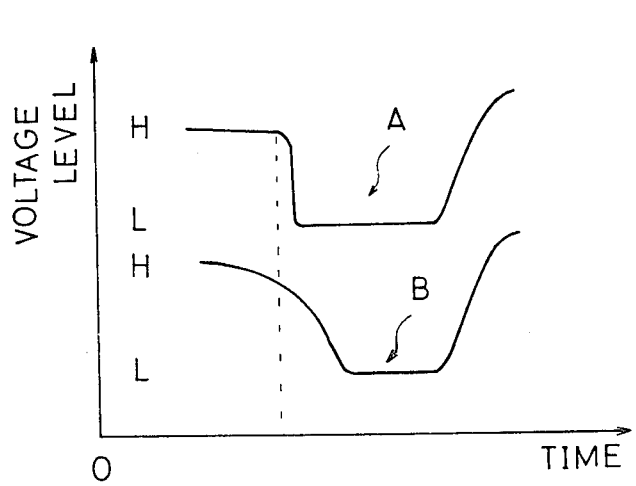
FIG. 2C illustrates voltage waveforms of the input signal and the corresponding bit line of the FIG. 2A memory.
Figure 2A:
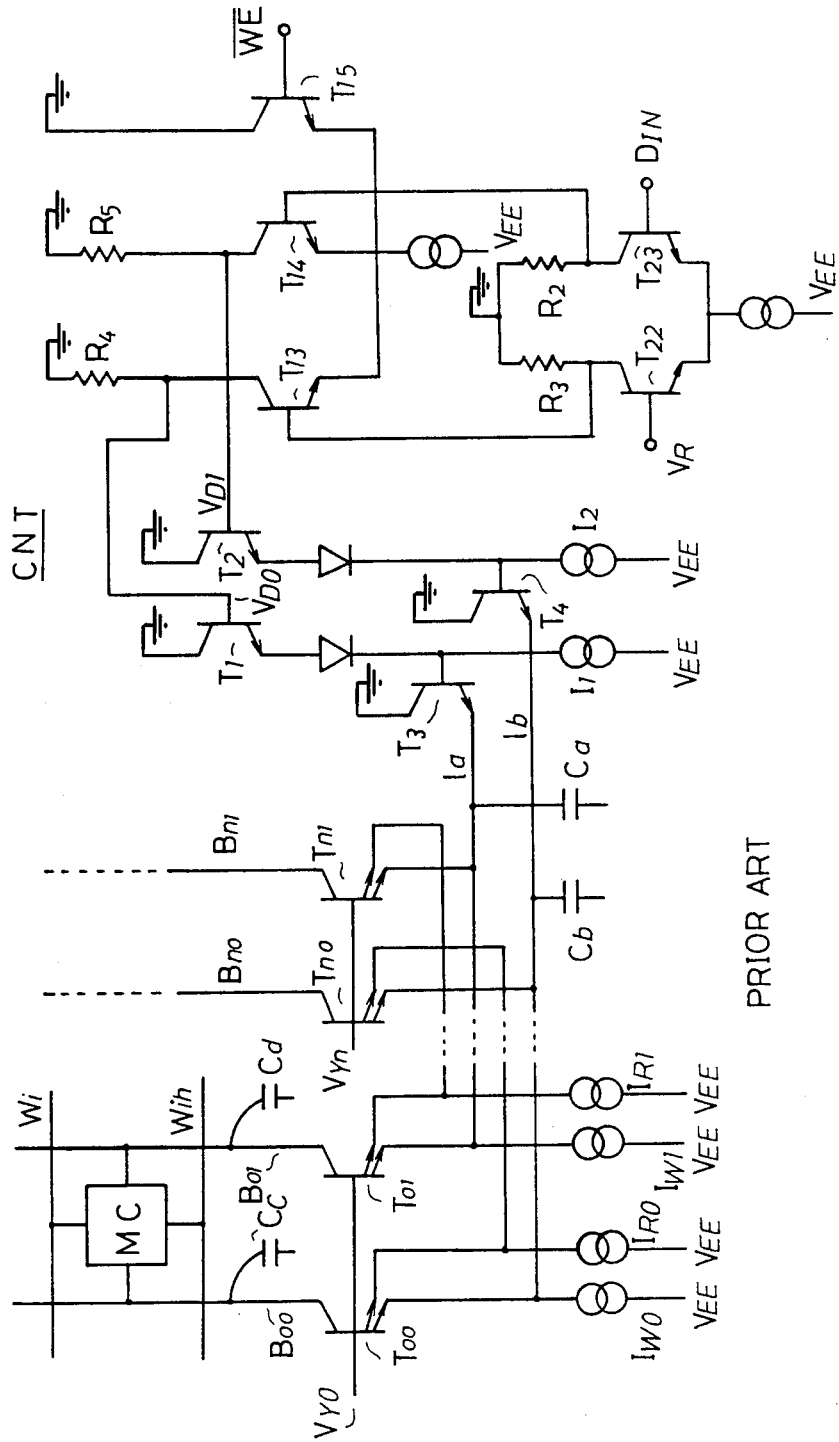
FIG. 2A is a circuit diagram showing the main portion of a conventional prior art bipolar memory.
Figure 3A:
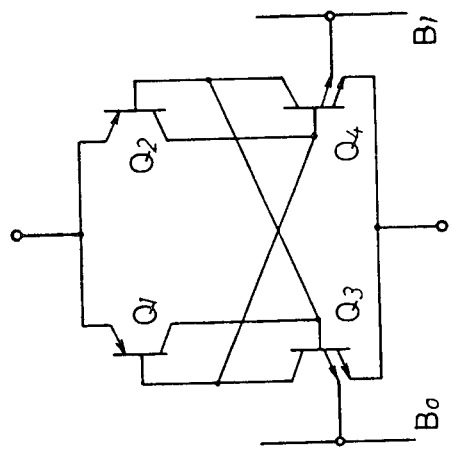
FIGS. 3A and 3B are circuit diagrams of other prior art memory cells.
Figure 3B:
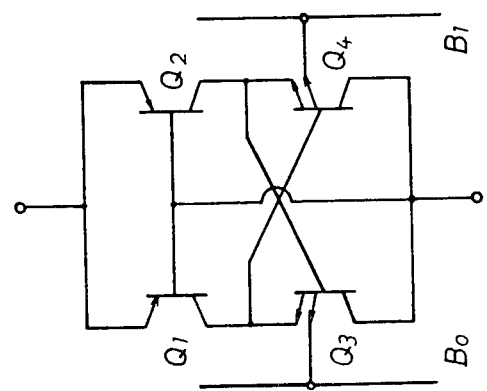

Pertaining to the known prior art devices, FIG. 2A shows the main portion of the bipolar memory in which PNP transistors are used as loads in each memory cell. MC represents a memory cell connected to each of the points at which a pair of bit (or column) lines $B_{j0}$ and $B_{j1}$ cross a pair of word (or row) lines $W_i$ and $W_{ih}$ wherein i and j denote any of 0, 1, 2—and h represent a hold line. When the memory cell is of the I²L type, the memory cell MC has a well-known arrangement such as shown in FIG. 3A, and when the memory cell is of the PNPN type, it has a well-known arrangement such as shown in FIG. 3B. In FIG. 3B a flip-flop circuit is formed by transistors $Q_3$ and $Q_4$ having bases and collectors connected and having multi-emitters connected to bit lines $B_0$ and $B_1$, respectively. This memory cell is different from the conventional one shown in FIG. 1 in that the memory of FIG. 3B uses, as loads, transistors of conductivity opposite to that of the driver transistors instead of the resistors $R_0$ and $R_0'$ and diodes $D_0$ and $D_0'$ i.e. driver transistors $Q_3$ and $Q_4$ in this memory cell are NPN type while load transistors $Q_1$ and $Q_2$ are PNP type. The memory cell of FIG. 3A is similar to FIG. 3B, but the first emitter of each transistor $Q_3$, $Q_4$ is cross-connected to the base of the other transistor.

Again looking at FIG. 2A, selecting multi-emitter transistors $T_{00}$, $T_{01}$-$T_{n0}'$ and $T_{n1}$ are inserted in bit lines $B_{00}$, $B_{01}$-$B_{n0}$, $B_{n1}$, respectively. First emitters of $T_{00}$-$T_{n0}$ are commonly connected to a current source $I_{W0}$ and the second emitters thereof are connected to a common current source $I_{R0}$, while first emitters of $T_{01}$-$T_{n1}$ are connected to a common current source $I_{W1}$ and second emitters thereof are connected to a common current source $I_{R1}$. Each pair of these transistors forms a current switch. $V_{y0}$-$V_{yn}$ represent bit line selecting voltages and when one of these voltages becomes a H (or high) level, the pair of transistors to which this H level voltage is applied is turned ON while the transistors of the other pairs of bit lines are turned OFF, thus achieving bit line selection. It is assumed in this example that when $V_{y0}$ is a H level, transistors $T_{00}$ and $T_{01}$ are turned ON, and bit lines $B_{00}$ and $B_{01}$ are selected. This is a condition under which write and read-out can be performed. Both the write and read-voltages $V_{D0}$ and $V_{D1}$ are a H level in the read-out condition, and transistors $T_1$, $T_2$, $T_3$ and $T_4$ are therefore turned ON. The respective currents of the write current sources $I_{W0}$ and $I_{W1}$ are supplied through transistors $T_3$ and $T_4$, but not from first emitters of transistors $T_{00}$ and $T_{01}$. Therefore, the current of read-out current sources $I_{R0}$ and $I_{R1}$ flows through bit lines $B_{00}$ and $B_{01}$. This read-out current serves to quickly bring the potentials of bit lines $B_{00}$ and $B_{01}$ in accordance with the storage status of the memory cell. When word lines $W_i$ and $W_{ih}$, for example, are further selected, they become a high level and the memory cell MC is selected. Providing that the memory cell MC is a H level on the side of bit line $B_{00}$ and a L level on the side of bit line $B_{01}$, the bit line $B_{00}$ becomes a H level while the bit line $B_{01}$ becomes an L level. This potential difference between these bit lines $B_{00}$ and $B_{01}$ is sensed by a sensor circuit (not shown), and thus read-out of the data stored in the memory cell MC is performed. Providing that the bit line $B_{00}$ is made a L level while the bit line $B_{01}$ is a H level just before this read-out, it is necessary that the bit line $B_{00}$ quickly rise to the H level while the bit line $B_{01}$ quickly falls to the L level. The rise time needed is determined by the drive capability of the memory cell MC and provides almost no problem, but it is difficult to achieve the required fall time without any special means of allowing discharge. Currents $I_{R0}$ and $I_{R1}$ (same symbols are here used to represent current sources and current values), particularly $I_{R1}$ in this example allows this discharge so as to cause a fast fall time. The current source comprises an emitter follower circuit as shown in FIG. 2B, in which the emitter of a transistor $T_0$ is connected via a resistor $R_C$ to a voltage source $V_{EE}$, the base thereof receives a specific voltage $V_C$, and the collector thereof corresponds to that terminal of the current source which is opposite the side of the current source connected to power source $V_{EE}$.

In FIG. 2A, one of the voltages $V_{D0}$ and $V_{D1}$ is made a H level while the other is made a L level or vice versa, according to the write information "1" or "0" occurring at the time of writing. Assume that $V_{D1}$ is a L level and $V_{D0}$ is a H level, thus the transistor $T_4$ is turned OFF while transistors $T_1$ and $T_3$ are turned ON and write current $I_{W0}$ flows through the bit line $B_{00}$. As is already well-known, therefore, current flows from the transistor $Q_3$ in the memory cell MC through the bit line $B_0$ (or $B_{00}$) and thus, the transistor $Q_3$ is turned OFF while the transistor $Q_4$ is turned ON, so that the storage status of the memory cell is inverted, thereby a write operation is performed.

A write and read current controlling circuit CNT serves as an input control at the time of reading and writing data; wherein $R_2$, $R_3$, $R_4$ and $R_5$ denote resistors connected to the respective collectors of transistors 23, 22, 13 and 14. The voltage level of the signal $D_{in}$ applied to the base of the transistor $T_{23}$ is compared to that of the reference signal $V_R$ applied to the base of transistor $T_{22}$. Only when a write-enable signal $\overline{WE}$ is applied to the base of transistor $T_{15}$, is the write operation conducted.

Lines $l_a$ and $l_b$ connecting the write and read current controlling circuit CNT to the current sources $I_{W0}$ and $I_{R1}$ each have a length longer than that of the area on which all of the pairs of bit lines $B_{00}$, $B_{01}$, and $B_{n1}$ are present, and have the emitters of transistors $T_{00}$, $T_{01}$-$T_{n0}$ and $T_{n1}$ connected thereto. Lines $l_a$ and $l_b$ therefore have large parasitic or stray capacities Ca and Cb. Even if the transistor $T_4$ is turned OFF in this example, the write current $I_{W0}$ is not immediately supplied from the bit line $B_{00}$ but, from the parasitic capacitance Cb for a little while. Namely, the charge associated with the parasitic capacitance Cb is discharge just after the transistor $T_4$ is turned OFF and current then flows from the bit line $B_{00}$ after the capacitance Cb has been discharged. This is shown by waveforms A and B in FIG. 2C, in which A denotes an input wave form e.g. the waveform of the power source for driving the line $l_a$, and B denotes a waveform of bit line power source. As apparent form FIG. 2C, the parasitic pulse capacitance makes the width narrow for writing, and thus the effective write time shortened, i.e., a long time period is needed to write. When write currents $I_{W0}$ and $I_{W1}$ are made large to improve this problem, the bit line selecting transistors $T_{00}$, $T_{01}$-$T_{n0}$, and $T_{n1}$ must be made large, making it necessary to increase the driving capacity or capability of drivers, i.e., circuits for generating voltages $V_{y0}$-$V_{yn}$. In addition, the bit lines also have parasitic capacities Cc and Cd, and the rise time of the signal appearing on the bit lines is slow when conventional current drive is employed.

Figure 4:
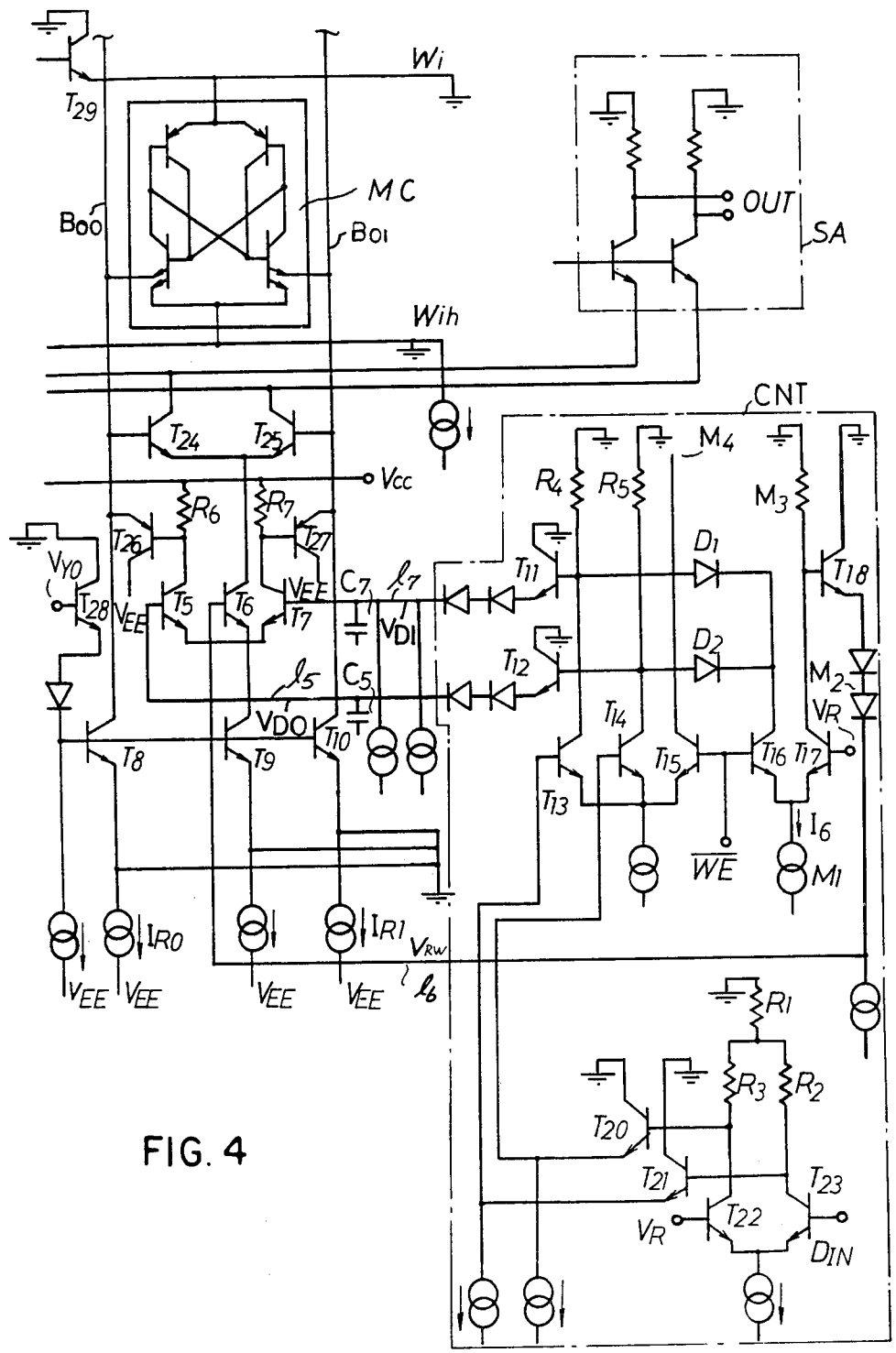
FIG. 4 represents a circuit diagram of one embodiment of the bipolar memory of the present invention.

The present invention is intended to improve the foregoing described matters, and FIG. 4 shows an embodiment of the present invention. Similar to FIG. 2A, FIG. 4 shows only a pair of bit lines $B_{00}$, $B_{01}$, a pair of word lines $W_i$, $W_{ih}$ and a memory cell MC, but a plurality of paired bit lines, word lines and memory cells corresponding to these paired bit lines and word lines are practically present in this embodiment. Transistors $T_8$ and $T_{10}$ serve to select bit lines and correspond to transistors $T_{00}$ and $T_{01}$ shown in FIG. 2A. Transistors $T_8$ and $T_{10}$ are single emitter type since they only handle read-out currents $I_{R0}$ and $I_{R1}$. Write currents are supplied from transistors $T_{26}$ and $T_{27}$. Tranisitors $T_{24}$ and $T_{25}$ represent bit line potential detecting transistors and transistors $T_5$, $T_6$, $T_7$ and $T_9$ control transistors $T_{24}$ and $T_{25}$. Transistors $T_{11}$-$T_{23}$ represent transistors for controlling transistors $T_6$-$T_7$, transistor $T_{28}$ represents a transistor for selecting bit lines, and transistor $T_{29}$ represents a transistor for driving word lines. $M_1$ represents a constant current source, $M_2$ a diode $M_3$ a resistor, and $M_4$ ground.

Write enable signal $\overline{WE}$ is a H level during the read-out condition. Transistors $T_{15}$ and $T_{16}$ are turned ON while transistors $T_{13}$, $T_{14}$ and $T_{17}$ are turned OFF at this time, and current $I_6$ flows equally through diodes $D_1$ and $D_2$. In this case, if resistors $R_4$ and $R_5$ are equal in resistance value, the base potentials of both of transistors $T_{11}$ and $T_{12}$ become $-RI_6/2$ wherein R represents the resistance values of $R_4$ and $R_5$, and the potentials $V_{D0}$ and $V_{D1}$ of lines $l_5$ and $l_7$ become $-RI_6/2 -2V_F$ wherein $V_F$ represents forward direction voltage of the diodes and is about 0.8 V. Since $T_{16}$ is ON during the read-out operation, the transistor $T_{17}$ is turned OFF and the base potential of transistor $T_{18}$ is about 0V. Potential $V_{RW}$ of line $l_6$ is therefore about $-2V_F$. Providing therefore that bit lines $B_{00}$ and $B_{01}$ shown in FIG. 4 are in a selected column, the transistor $T_9$ is turned ON, the transistor $T_6$ (of current switches comprising transistors $T_5-T_7$), is also turned ON while tranistors $T_5$ and $T_7$ are turned OFF, no current flows through resistors $R_6$ and $R_7$, and transistors $T_{26}$ and $T_{27}$ are turned OFF. Current flowing through the transistor $T_6$ flows through the bit line differential voltage detecting transistors $T_{24}$ and $T_{25}$, a transistor (within the memory cell) connected to a high potential bit line is turned ON and this is detected by a sense amplifier SA, thereby generating read-out output OUT. Output OUT has two terminals, one for positive-phase output and the other for negative-phase output.

Write enable signal $\overline{WE}$ is a L level during the write operation, transistors $T_{15}$ and $T_{16}$ are turned OFF, and one of the transistors $T_{13}$ and $T_{14}$, and the transistor $T_{17}$ are turned ON. Write data $D_{IN}$ is applied to the transistors $T_{23}$. Data "1" and "0" correspond to H and L voltage levels, respectively, in comparison with the reference voltage $V_R$ which is applied to the transistor $T_{22}$. Transistors $T_{23}$ and $T_{20}$ are turned ON while $T_{22}$ and $T_{21}$ are turned OFF when data is "1", but $T_{23}$ and $T_{20}$ are turned OFF while $T_{22}$ and $T_{21}$ are turned ON when data is "0". The turned OFF while $T_{22}$ and $T_{21}$ are turned ON when data is "0". The ON and OFF status of transistors $T_{13}$ and $T_{14}$ is determined by the ON and OFF status of transistors $T_{20}$ and $T_{21}$, and when $T_{20}$ is ON and $T_{21}$ OFF, $T_{13}$ is turned ON and $T_{14}$ OFF. When $T_{20}$ is OFF and $T_{21}$ ON, $T_{13}$ is turned OFF and $T_{14}$ ON. One of the potentials of lines $l_5$ and $l_7$ therefore becomes a H level while the other thereof is a L level. As $T_{17}$ is turned ON, the base potential of $T_{18}$ becomes a L level, $V_{RW}$ also becomes a L level, $T_6$ of the current switches $T_5-T_7$ is turned OFF, one of $T_5$ and $T_7$ is turned ON and the other thereof OFF. Transistors $T_{24}$ and $T_{25}$ are thus turned OFF, rendering the lines connected to the sense amplifier SA inoperative, and one of transistors $T_{26}$ and $T_{27}$ is turned ON to reduce the potentials of the bit lines associated with this transistor. PNP transistors $T_{26}$ and $T_{27}$ employed as emitter followers, have large driving capacity, that is, that one of transistors $T_{26}$ and $T_{27}$ which is turned ON becomes equivalent to the situation where the corresponding bit line is connected to $V_{EE}$ and thus, the potential of that bit line is quickly reduced, even if parasitic capacitances are present in the bit line. Further, lines $l_5-l_7$ serve only to supply base currents to transistors $T_5-T_7$ and do not flow write and read currents as does the circuit shown in FIG. 2A, so that operation delay caused by this portion is negligible. Furthermore, since the parasitic capacitances $C_7$ and $C_5$ appearing on the respective bases of transistors $T_7$ and $T_5$ in this invention are generally smaller than the parasitic capacitances $C_7$ and $C_5$ appearing on the respective emitters of transistors $T_{j0}$ and $T_{j1}$ in the prior art circuit, such as shown in FIG. 2B, parasitic capacitances are reduced to a greater extent as compared with those in the conventional memory, and this reduction of parasitic capacitances serves to make the operation delay of the bit lines smaller.

Figure 5:
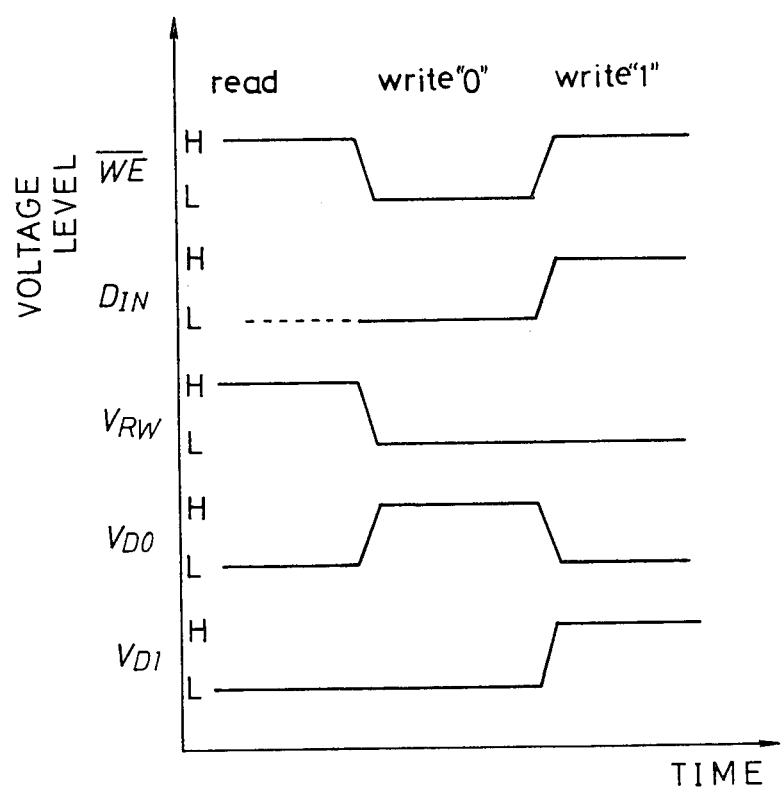
FIG. 5 shows waveforms of various signals used in the embodiment of the present invention shown in FIG. 4.

FIG. 5 is a waveform diagram showing the write enable signal WE, data $D_{IN}$, read control voltage $V_{RW}$ and write control voltages $V_{D0}$ and $V_{D1}$.

The circuit of the present invention provides that write current flows from the memory cell MC to voltage source $V_{EE}$ via one of the bit lines and either transistors $T_{26}$ or $T_{27}$ to bit lines and that the write and read control circuit CNT serves to control the base potentials of these transistors. Since the present circuit is operated under the voltage control method, write currents can be supplied at high speed to the memory cell and the effective time for writing data can be made longer, that is, the time period for writing-in data is increased. Transistors $T_{26}$ and $T_{27}$ whose collectors are connected to the most negative voltage source $V_{EE}$ are PNP emitter-follower type and can be the vertical type (PNP semiconductor transistor combined with NPN semiconductor transistor are normally lateral transistors) thus having a larger gain. In addition, the bit line selecting transistors do not have to be large-sized multi-emitter ones as shown in FIG. 2A, and since small-size single emitter transistors $T_8-T_{10}$ serve to reduce bit line potentials during the read-out operation as described above, $T_8$ and $T_{10}$ may be omitted, thus the read current sources $I_{R0}$ and $I_{R1}$ are connected directly to the bit lines. Transistor $T_9$ can be regarded as the true bit line selecting transistor from this viewpoint. Transistors $T_5$ and $T_7$ may also be omitted in such a way that bases to transistors $T_{26}$ and $T_{27}$ are driven directly by potentials of lines $l_5$ and $l_7$. In this embodiment, the transistors of each flip-flop circuit forming each memory cell are NPN type, but when they are PNP type, the other transistor may be NPN type.

According to the present invention as described above, write time period in the memory having a group of static memory cells in which PNP transistors are employed as loads can be made shorter and bit line selecting transistors and their drivers can be made small-sized, simple in construction and smaller in capacity.

We claim:

1. A semiconductor memory having a write cycle and being operatively connected to receive write data, including:

a memory cell having a pair of first transistors cross coupled to each other, each transistor having a first conductivity type, a base, a collector and an emitter;

a pair of word lines respectively connected to said pair of first transistors;

a pair of bit lines respectively connected to a corresponding one of the emitters of said pair of first transistors;

a pair of second transistors, each of said pair of second transistors having a conductivity type different than said first conductivity type, having a base, having a collector, and having an emitter connected to a respective one of said pair of bit lines; and means for providing complementary signals responsive to said write data, said complementary signals being applied to respective ones of the bases of said pair of second transistors so that a write current flows from the memory cell to a voltage source means via one of said pair of bit lines and one of said pair of second transistors only during the write cycle.

2. A semiconductor memory according to claim 1, wherein each of said second transistors is a PNP transistor.

3. A semiconductor memory according to claim 2, wherein said semiconductor memory comprises a further pair of transistors, each of said further pair of transistors having collectors connected to the base of said NPN transistor and to said voltage source means via a resistor, having emitters connected to each other, and having bases, connected to said means for supplying complementary signals, for respectively receiving said complementary signals.

* * * * *